US007692309B2

(12) United States Patent
Cox

(10) Patent No.: US 7,692,309 B2

(45) Date of Patent: Apr. 6, 2010

(54) CONFIGURING STRUCTURED ASIC FABRIC USING TWO NON-ADJACENT VIA LAYERS

(75) Inventor: William D. Cox, Chapel Hill, NC (US)

(73) Assignee: ViASIC, Inc., Durham, NC (US)

( * ) Notice: Subject to any disclaimer, the term of this patent is extended or adjusted under 35 U.S.C. 154(b) by 428 days.

(21) Appl. No.: 11/850,791

(22) Filed: Sep. 6, 2007

(65) Prior Publication Data

US 2009/0065813 A1 Mar. 12, 2009

(51) Int. Cl.
*H01L 23/48* (2006.01)

(52) U.S. Cl. ............................ 257/776; 257/E23.145; 257/E23.151; 438/598

(58) Field of Classification Search ................ 257/776, 257/E23.145, E23.151; 438/598
See application file for complete search history.

(56) References Cited

U.S. PATENT DOCUMENTS

| | | | |
|---|---|---|---|
| 4,641,108 | A | 2/1987 | Gill |
| 4,713,792 | A | 12/1987 | Hartmann et al. |
| 4,734,654 | A | 3/1988 | Fernandez |
| 4,760,349 | A | 7/1988 | Park et al. |
| 4,852,015 | A | 7/1989 | Doyle, Jr. |
| 5,068,603 | A | 11/1991 | Mahoney |
| 5,317,919 | A | 6/1994 | Awtrey |
| 5,367,430 | A | 11/1994 | DeVoe et al. |
| 5,404,265 | A | 4/1995 | Moresco et al. |
| 5,459,634 | A | 10/1995 | Nelson et al. |
| 5,517,040 | A | 5/1996 | Hedman et al. |
| 5,590,016 | A | 12/1996 | Fujishiro et al. |
| 5,815,004 | A | 9/1998 | Trimberger et al. |
| 5,815,726 | A | 9/1998 | Cliff |

(Continued)

FOREIGN PATENT DOCUMENTS

| | | |
|---|---|---|
| EP | 0491567 | 6/1992 |
| EP | 0499383 | 8/1992 |

OTHER PUBLICATIONS

"International Search Report" (European Patent Office), in Triad Semiconductor, Inc. International Patent Application Serial No. PCT/US2005/005836, Aug. 1, 2005.

(Continued)

*Primary Examiner*—Trung Dang
(74) *Attorney, Agent, or Firm*—James D. Wright; Chad D. Tillman; Tillman Wright, PLLC

(57) ABSTRACT

An application-specific integrated circuit (ASIC) is customized using two non-adjacent via layers. An array of logic cells, each including a plurality of logic devices, are arranged in a plurality of non-customized base layers. A first routing grid, which includes a first non-customized metal routing layer, a customized via layer, and a second non-customized metal routing layer, is disposed on top of the plurality of non-customized layers. A second routing grid, which includes a third non-customized metal routing layer, another customized via layer, and a fourth non-customized metal routing layer, is disposed above the first routing grid. A non-customized via layer is disposed above the first routing grid and beneath the second routing grid. The routing grids and the non-customized via layer collectively facilitate routing connections to and from the logic cells.

33 Claims, 12 Drawing Sheets

U.S. PATENT DOCUMENTS 5,821,776 A 10/1998 McGowan
5,825,202 A 10/1998 Tavana et al.
5,874,834 A 2/1999 New
5,883,423 A 3/1999 Patwa et al.
5,898,318 A 4/1999 Pedersen
5,905,385 A 5/1999 Sharpe-Geisler
5,999,015 A 12/1999 Cliff et al.
6,014,038 A 1/2000 How et al.
6,020,755 A 2/2000 Andrews et al.
6,078,191 A 6/2000 Chan et al.
6,150,837 A 11/2000 Beal et al.
6,166,403 A 12/2000 Castagnetti et al.
6,184,707 B1 2/2001 Norman et al.
6,190,957 B1 2/2001 Mochizuki et al.
6,194,912 B1 2/2001 Or-Bach
6,218,197 B1 4/2001 Kasai
6,235,573 B1 5/2001 Lee et al.
6,236,229 B1 5/2001 Or-Bach
6,242,767 B1 6/2001 How et al.
6,245,634 B1 6/2001 Or-Bach
6,278,148 B1 8/2001 Watanabe et al.
6,294,927 B1 9/2001 Yoeli et al.
6,331,733 B1 12/2001 Or-Bach et al.
6,331,789 B2 12/2001 Or-Bach
6,331,790 B1 12/2001 Or-Bach et al.
6,411,494 B1 6/2002 Watt
6,448,114 B1 9/2002 An et al.
6,467,074 B1 10/2002 Katsioulas et al.
6,476,695 B1 11/2002 Nakamichi
6,492,833 B1 12/2002 Asson et al.
6,507,216 B1 1/2003 Lane et al.
6,580,289 B2 6/2003 Cox
6,588,005 B1 7/2003 Kobayashi et al.
6,614,645 B1 9/2003 Sakurai et al.
6,646,323 B2 11/2003 Dirnecker et al.
6,646,860 B2 11/2003 Takaramoto et al.
6,684,173 B2 1/2004 Kessenich et al.
6,693,454 B2 2/2004 Cox
6,696,856 B1 2/2004 Smith et al.
6,780,745 B2 8/2004 Shoji et al.
6,873,185 B2 3/2005 Cox
6,938,234 B1 8/2005 Teig et al.
6,982,454 B2 1/2006 Giuroiu et al.
7,073,157 B2 7/2006 DeHon et al.
7,089,524 B1 8/2006 Teig et al.
7,157,937 B2 * 1/2007 Apostol et al. ................ 326/41
7,239,194 B2 7/2007 Azrai et al.
7,248,071 B2 7/2007 Cox
7,334,208 B1 2/2008 Cox
7,335,966 B2 2/2008 Ihme et al.
7,378,874 B2 5/2008 Bharath et al.
7,449,371 B2 11/2008 Kemerling et al.
7,538,580 B2 5/2009 Cox
2001/0038297 A1 11/2001 Or-Bach
2002/0043988 A1 4/2002 Or-Bach et al.
2002/0084509 A1 7/2002 Ballantine et al.
2002/0085334 A1 7/2002 Figueroa et al.
2002/0186045 A1 12/2002 Cox
2003/0089937 A1 5/2003 Yamauchi et al.
2003/0214322 A1 11/2003 Cox
2003/0234666 A1 12/2003 Cox
2004/0004241 A1 1/2004 Aton
2004/0027156 A1 2/2004 Amerilio et al.
2004/0129966 A1 7/2004 Giuroiu et al.
2005/0117436 A1 6/2005 Cox
2005/0189614 A1 9/2005 Ihme et al.
2005/0224982 A1 10/2005 Kemerling et al.
2006/0139057 A1 * 6/2006 Or-Bach et al. ............... 326/41
2007/0188188 A1 * 8/2007 Or-Bach et al. ............... 326/38
2007/0262789 A1 11/2007 Cox
2008/0054939 A1 3/2008 Bharath et al.
2008/0108201 A1 5/2008 Ihme et al.
2009/0032968 A1 2/2009 Kemerling et al.
2009/0061567 A1 3/2009 Kemerling et al.
2009/0210848 A1 8/2009 Cox

OTHER PUBLICATIONS

"International Search Report" (European Patent Office), in Triad Semiconductor, Inc. International Patent Application Serial No. PCT/US2005/011361, Aug. 5, 2005.
"Written Opinion of the International Search Authority" (European Patent Office), in Triad Semiconductor, Inc. International Patent Application Serial No. PCT/ US2005/005836, Aug. 1, 2005.
"Written Opinion of the International Search Authority" (European Patent Office), in Triad Semiconductor, Inc. International Patent Application Serial No. PCT/US2005/011361, Aug. 5, 2005.
"International Preliminary Examination Report" (European Patent Office), in Triad Semiconductor, Inc. International Patent Application Serial No. PCT/US2005/005836, Jul. 14, 2006.
"International Preliminary Examination Report" (European Patent Office), in Triad Semiconductor, Inc. International Patent Application Serial No. PCT/US2005/011361, Jul. 6, 2006.

* cited by examiner

20

CONFIGURING STRUCTURED ASIC FABRIC USING TWO NON-ADJACENT VIA LAYERS

COPYRIGHT STATEMENT

All of the material in this patent document is subject to copyright protection under the copyright laws of the United States and of other countries. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE PRESENT INVENTION

1. Field of the Present Invention

The present invention relates generally to semiconductor devices designed from industry standard existing standard-cell ASIC libraries, and, in particular, to an architecture where all semiconductor layer masks are reusable except for two non-adjacent via layers which are used to configure the device.

2. Background

For many years, gate array semiconductor devices have been used to provide quick-turnaround ("quick-turn"), low non-recurring-expense ("NRE") semiconductor devices for a variety of purposes. Traditionally, semiconductor wafers are processed up to but not including the first (bottom) metal layer, and saved in inventory. When a customer orders a semiconductor device to be fabricated for a specific application (an application-specific integrated circuit or "ASIC"), the customer only pays for the semiconductor layer masks ("masks") to configure the metal layers, including both the metal routing layers and via layers, but not the transistor layers below. Thus, NRE is reduced. The wafers can be completed quickly, since only the metal routing layers and via layers remain to be fabricated, reducing turn-around time.

Recently more and more layers of metal have been incorporated into gate array semiconductor devices, more commonly known simply as "gate arrays." Rather than using two or three layers of metal, six to eight layers of metal, including both metal routing layers and the via layers used to connect one metal routing layer to the metal routing layer directly above or below, are now common. As a result, gate arrays are often no longer very low-NRE, or quick-turn. In order to regain the advantages of earlier gate arrays, several vendors have developed logic arrays, consisting of multiple, substantially identical logic cells, which can be configured for an application with fewer or cheaper masks. These types of gate arrays are commonly known as structured ASICs. Notably, although fewer masks are required to configure these ASICs, it is not the total number of metal layers and hence masks used to create the finished or customized device that is reduced. Rather, the number of masks required to impart the custom configuration to the device is reduced to only a subset of the total number of metal layers in a finished device. For example, so-called "one-mask" devices, in which only a single metal layer and hence a single mask imparts customization, can in theory reduce both NRE and turn-time.

Structured ASICs are a well-known solution for reducing mask costs when fabricating a semi-custom integrated circuit chip. These ASICs combine large numbers of programmable blocks of logic devices into an array of logic cells to create a device that is specifically adapted for a particular application, but at a cost that is lower than that of developing a completely new logic cell from scratch. Most structured ASICs use industry standard libraries of standard-cells, supported by large Electronic Design Automation (EDA) companies. Standard-cells are small logic cells with predefined design characteristics such as their layout, timing, and other electrical characteristics. Each group of logic devices that has a unique physical layout is defined as one standard-cell. The library contains files that include the layout, timing and other electrical characteristics for each standard-cell in the library. The structured ASICs combine groups of standard-cells to form larger logic cells to create a device that is specifically adapted for a particular application.

After the logic cells of the structured ASIC are mapped or designed from the standard-cells, they are then arrayed, and then the metal layers to connect the logic cells are generated. The process of arraying the logic cells and generating the metal layers is commonly referred to as the place and route process. Most non-structured ASICs use place and route tools from major vendors, such as Cadence, Synopsys, or Magma, that are designed for use with these standard-cell libraries in a full custom design. However, when applied to structured ASICs, these tools have limitations that restrict how they route signals, i.e., they route signals only on full custom routing layers and via layers. For example, if a structured ASIC has six custom metal layers (i.e., three via layers and three metal routing layers), then only three metal routing layers can be used to route signals and the three via layers to connect them.

Furthermore, when the current place and route tools are used to route these signals, they impart certain rules and restrictions on how each layer is routed. For example, they may require two metal routing layers ("METAL2" and "METAL4") to run horizontally, and may require a third metal routing layer ("METAL3") to run vertically. The way the via layers are cut to connect the metal routing layers also has restrictions in the place and route tool. Also, the tool will not allow routing or via connections between fixed metal routing layers already incorporated into the logic array or the fixed logic cells, including METAL1 and possibly some METAL2. These rules and restrictions are built into the tools and optimized for full custom ASICs to achieve the highest density logic and routing. Unfortunately, the tools are not designed to achieve logic mask reuse and thus avoid NRE.

By carefully controlling the way the standard-cell libraries are designed, not necessarily using the industry standard libraries, and by carefully controlling the way the metal layers are created in the structured ASIC architecture, not necessarily using the major vendors' place and route tools designed for full custom ASICs, the number of custom masks that may be required may often be reduced to just one mask. Using a single via layer to customize a semiconductor device is one technology for creating "one-mask" devices. Significant advantages of single via configuration are low configuration cost and faster turn-around time. The single via configuration is completed by first fabricating the semiconductor transistor layers for the mask configurable gate array as described above. Then, the plurality of metal layers are fabricated on top which creates a specialized logic array that has the characteristics which enable the specialized place and route tool to route and connect signals on and between the fixed metal routing layers using a single via layer. Single via layer configuration is more fully disclosed in U.S. Pat. No. 6,580,289 to Cox (the "'289 patent"), the entirety of which is incorporated herein by reference.

However, single via configuration also comes at a steep price: over twice the area is required to complete routing as compared to using standard-cells from an industry standard library and using an industry standard place and route tool. One solution to this problem is to use embedded distributed SRAM which gives the ASICs more than double the area for routing. The embedded distributed SRAM solution is more fully disclosed in U.S. Pat. No. 6,693,454 to Cox, the entirety of which is incorporated herein by reference. The embedded distributed SRAM structured ASICs have proven to have the lowest production cost of any structured ASIC, both in terms of total die area, and mask costs.

Unfortunately, although the single via configuration with embedded distributed SRAM offers many advantages for semiconductor designers, there are still significant market barriers to the adoption of this process. For example, for a customer to use the single via configuration with the embedded distributed SRAM process, it requires them to use non-industry standard standard-cell and macro libraries. As stated previously, most customers only use the industry standard libraries supported by large EDA companies such as Cadence, Synopsys, and Magma. Unfortunately, customers are reluctant to adopt custom libraries and add the additional time and expense of maintaining an additional set of libraries for synthesis, timing analysis, and the like. Customers have also had concerns about the large area over which the logic is spread, especially when they were not using the distributed SRAM. When the high cost of developing a custom library for a new fabrication process is added to the long development time of the new library, the market barriers become prohibitive in many cases.

Accordingly, a need exists for a new solution to address these issues while still maintaining many of the benefits of the single via configuration process.

SUMMARY OF THE PRESENT INVENTION

The present invention comprises an architecture for gate-array type devices, such as ASICs, that is used at both the individual cell level and the chip level. The architecture of the invention has a number of features that are advantageous in terms of efficiency and density. In at least some embodiments, a semiconductor device comprising an array of logic cells and programmable metal includes one or more gate structures that are pre-wired in a first process geometry, where a plurality of inputs and/or outputs of the gate structures are available for routing in at least two layers of the programmable metal, where the programmable metal is in a second process geometry. In general terms, the architecture incorporates two non-adjacent via configuration layers and access wires on two horizontal metal routing layers to facilitate usage of the non-adjacent via configuration layers.

Advantageously, the structured ASIC logic arrays that are utilized may be built using the customer's own standard-cell libraries. No new transistor layouts are necessarily required and thus no customer library characteristics must be met. This allows customers to use their existing standard-cell ASIC libraries and verification (simulation) flows. Also, since the customer has already characterized the standard-cells libraries for all necessary electrical characteristics, no additional characterization is required.

The architecture of the present invention requires no distributed SRAM, which greatly increases the logic density versus prior art architectures, but also could make routing much more limited. The use of two non-adjacent via configuration layers helps alleviate these routing limitations. To further improve routability, "access wires" are used to facilitate usage of non-adjacent configuration via layers.

Also advantageously, because the invention requires no custom transistor layout or cell characterization, developing a library to take advantage of this architecture is much faster and cheaper than developing a full custom library. This greatly reduces cost to the customer, as well as schedule impact and overall risk.

Broadly defined, the present invention according to one aspect is a semiconductor device including: a plurality of non-customized layers in which are arranged an array of logic cells, each logic cell including a plurality of logic devices; a first routing grid that includes a first non-customized metal routing layer, a first via layer, and a second non-customized metal routing layer, wherein the first via layer is a customized via layer that is disposed directly on top of the first non-customized metal routing layer and the second non-customized metal routing layer is disposed directly on top of the first via layer; a second routing grid, disposed above the first routing grid, that includes a third non-customized metal routing layer, a second via layer, and a fourth non-customized metal routing layer, wherein the second via layer is a customized via layer that is disposed directly on top of the third non-customized metal routing layer and the fourth non-customized metal routing layer is disposed directly on top of the third via layer; and a third via layer disposed above the first routing grid and beneath the second routing grid, the third via layer being a non-customized via layer.

In a feature of this aspect, the device is an application-specific integrated circuit. In other features of this aspect, the first metal routing layer is METAL2, the first via layer is VIA23 and the second metal routing layer is METAL3; and the third metal routing layer is METAL4, the second via layer is VIA45 and the fourth metal routing layer is METAL5.

In another feature of this aspect, a fifth non-customized metal routing layer and a fourth via layer are interposed between the first routing grid and the second routing grid, the fourth via layer being non-customized.

Alternatively, in another feature of this aspect, a fifth non-customized metal routing layer and a fourth via layer are disposed above the fourth metal routing layer. In further features of this aspect, the fifth metal routing layer forms a part of a third routing grid, the third routing grid further including a sixth metal routing layer and a fifth via layer that are disposed above the fifth metal routing layer; and the fifth metal routing layer is METAL6, the fifth via layer is VIA67 and the sixth metal routing layer is METAL7.

In another feature of this aspect, the array of logic cells are fabricated in a first process geometry, and wherein the customized layers are fabricated in a second process geometry.

In another feature of this aspect, at least some of the logic cells include a DFFR, a plurality of MUXs, and a plurality of NAND2s. In a further feature, the at least some of the logic cells further comprise a plurality of NANDI2s.

In another feature of this aspect, the first via layer and the second via layer are customized by configuring a plurality of vias in the first via layer and a plurality of vias in the second via layer to create connections from the first routing grid to the second routing grid. In a further feature, the connections created from first routing grid to the second routing grid are completed using access wires, wherein each access wire includes a fixed wire segment in the second metal routing layer, a fixed via in the third via layer, and a fixed wire segment in the third metal routing layer.

In another feature of this aspect, the logic cells are formed or selected from industry-standard libraries of standard-cells.

Alternatively, in another feature of this aspect, the logic cells are formed or selected from user-customized libraries of standard-cells.

Broadly defined, the present invention according to another aspect is a semiconductor device including: a plurality of non-customized layers in which are arranged an array of logic cells, each logic cell including a plurality of logic devices; at least four non-customized metal routing layers, including first, second, third and fourth metal routing layers, disposed on top of the plurality of non-customized layers, for routing connections; and at least three via layers, including first, second and third via layers, interspersed between the four metal routing layers such that the first via layer is disposed above the first metal routing layer and beneath the second metal routing layer, the second via layer is disposed above the third metal routing layer and beneath the fourth metal routing layer, and the third via layer is disposed above the second metal routing layer and beneath the third metal routing layer; wherein the first via layer and the second via layers are customized but the third via layer is not customized.

In a feature of this aspect, the device is an application-specific integrated circuit. In further features, the first via layer is disposed directly on top of the first metal routing layer, the second metal routing layer is disposed directly on top of the first via layer, the second via layer is disposed directly on top of the third metal routing layer, and the fourth metal routing layer is disposed directly on top of the second via layer; the first metal routing layer is METAL2, the first via layer is VIA23 and the second metal routing layer is METAL3; and the third metal routing layer is METAL4, the second via layer is VIA45 and the fourth metal routing layer is METAL5.

In another feature of this aspect, a fifth non-customized metal routing layer and a fourth via layer are interposed between the first via layer and the second via layer, and the fourth via layer is non-customized.

Alternatively, in another feature of this aspect, a fifth non-customized metal routing layer and a fourth via layer are disposed above the fourth metal routing layer. In further features of this aspect, a sixth metal routing layer and a fifth via layer are disposed above the fifth metal routing layer; and the fifth metal routing layer is METAL6, the fifth via layer is VIA67 and the sixth metal routing layer is METAL7.

In another feature of this aspect, the array of logic cells are fabricated in a first process geometry, and wherein the customized layers are fabricated in a second process geometry.

In another feature of this aspect, at least some of the logic cells include a DFFR, a plurality of MUXs, and a plurality of NAND2s. In a further feature, the at least some of the logic cells further comprise a plurality of NANDI2s.

In another feature of this aspect, the first via layer and the second via layer are customized by configuring a plurality of vias in the first via layer and a plurality of vias in the second via layer to create connections from the first metal routing layer to the fourth metal routing layer. In a further feature, the connections created from the first metal routing layer to the fourth metal routing layer are completed using access wires, with each access wire including a fixed wire segment in the second metal routing layer, a fixed via in the third via layer, and a fixed wire segment in the third metal routing layer.

In another feature of this aspect, the logic cells are formed or selected from industry-standard libraries of standard-cells.

Alternatively, in another feature of this aspect, the logic cells are formed or selected from user-customized libraries of standard-cells.

Broadly defined, the present invention according to another aspect is a method of making a semiconductor device having at least first and second via and third via layers, the method including: forming a plurality of non-customized layers in which are arranged an array of logic cells, each logic cell including a plurality of logic devices; forming a first routing grid, including forming a first non-customized metal routing layer above the plurality of non-customized layers, forming a first via layer directly on top of the first non-customized metal routing layer, wherein the first via layer is a customized via layer, and forming a second non-customized metal routing layer directly on top of the first via layer; forming a second routing grid, above the first routing grid, including forming a third non-customized metal routing layer, forming a second via layer directly on top of the third non-customized metal routing layer, wherein the second via layer is a customized via layer, and forming a fourth non-customized metal routing layer directly on top of the third via layer; and forming a third via layer above the first routing grid and beneath the second routing grid, the third via layer being a non-customized via layer.

In a feature of this aspect, the step of forming the first via layer includes producing a first customized mask, and forming the first via layer using the first customized mask; and the step of forming the second via layer includes producing a second customized mask, and forming the second via layer using the second customized mask. In a further feature, the device is an application-specific integrated circuit.

In another feature of this aspect, the step of forming the first routing grid includes forming the first metal routing layer directly on top of the plurality of non-customized layers. In further features, the first metal routing layer is METAL2, the first via layer is VIA23 and the second metal routing layer is METAL3; and the third metal routing layer is METAL4, the second via layer is VIA45 and the fourth metal routing layer is METAL5.

In another feature of this aspect, the method further includes the steps of forming a fifth non-customized metal routing layer and forming a fourth via layer between the first via layer and the second via layer, the fourth via layer being non-customized. In further features, the method further includes the steps of forming a fifth non-customized metal routing layer and forming a fourth via layer above the fourth metal routing layer; the steps of forming a fifth non-customized metal routing layer and a fourth via layer above the fourth metal routing layer are part of a step of forming a third routing grid, and the step of forming a third routing grid further includes the steps of forming a sixth metal routing layer and forming a fifth via layer above the fifth metal routing layer; and the fifth metal routing layer is METAL6, the fifth via layer is VIA67 and the sixth metal routing layer is METAL7.

In another feature of this aspect, the step of forming the plurality of non-customized layers in which are arranged an array of logic cells includes forming the non-customized layers in a first process geometry, and the steps of forming the first and second customized via layers includes fabricating the first and second customized via layers in a second process geometry.

In another feature of this aspect, at least some of the logic cells include a DFFR, a plurality of MUXs, and a plurality of NAND2s. In a further feature, the at least some of the logic cells further comprise a plurality of NANDI2s.

In another feature of this aspect, forming the first and second via layers includes configuring a plurality of vias in the first via layer and a plurality of vias in the second via layer to create connections from the first routing grid to the second routing grid. In a further feature, the connections created from the first routing grid to the second routing grid are completed using access wires, with each access wire including a fixed wire segment in the second metal routing layer, a fixed via in the third via layer, and a fixed wire segment in the third metal routing layer.

In another feature of this aspect, the step of forming a plurality of non-customized logic cell layers includes forming or selecting the logic cells from industry-standard libraries of standard-cells. Alternatively, in another feature of this aspect, the step of forming a plurality of non-customized logic cell layers includes forming or selecting the logic cells from user-customized libraries of standard-cells.

Alternatively, in another feature of this aspect, the method further includes the step of prioritizing use of the first routing grid for short- to medium-distance routing, and prioritizing use of the second routing grid for medium- to long-distance routing.

Broadly defined, the present invention according to another aspect is a method of making a semiconductor device, the method including: forming a plurality of non-customized layers in which are arranged an array of logic cells, each logic cell including a plurality of logic devices; forming at least four non-customized metal routing layers, including first, second, third and fourth metal routing layers, on top of the plurality of non-customized layers, for routing connections; forming a first via layer, which is a customized via layer, above the first metal routing layer and beneath the second metal routing layer; forming a second via layer, which is a customized via layer, above the third metal routing layer and beneath the fourth metal routing layer; and forming a third via layer, which is a non-customized via layer, above the second metal routing layer and beneath the third metal routing layer.

In a feature of this aspect, the step of forming the first via layer includes producing a first customized mask, and forming the first via layer using the first customized mask; and the step of forming the second via layer includes producing a second customized mask, and forming the second via layer using the second customized mask. In a further feature, the device is an application-specific integrated circuit.

In another feature of this aspect, the step of forming the metal routing layers includes forming the second metal routing layer directly on top of the first via layer and forming the fourth metal routing layer directly on top of the second via layer; the step of forming the first via layer includes forming the first via layer directly on top of the first metal routing layer; and the step of forming the second via layer includes forming the second via layer directly on top of the third metal routing layer. In further features, the first metal routing layer is METAL2, the first via layer is VIA23 and the second metal routing layer is METAL3; and the third metal routing layer is METAL4, the second via layer is VIA45 and the fourth metal routing layer is METAL5.

In another feature of this aspect, the method further includes the steps of forming a fifth non-customized metal routing layer and forming a fourth via layer between the first via layer and the second via layer, with the fourth via layer being non-customized.

Alternatively, in another feature of this aspect, the method further includes forming a fifth non-customized metal routing layer and forming a fourth via layer above the fourth metal routing layer. In a further feature, the method further includes forming a sixth metal routing layer and forming a fifth via layer above the fifth metal routing layer.

In another feature of this aspect, forming the plurality of non-customized metal routing layers and the non-customized via layer includes fabricating the plurality of non-customized metal routing layers and the non-customized via layer in a first process geometry, and forming the customized via layers includes fabricating the customized via layers in a second process geometry.

In another feature of this aspect, at least some of the logic cells include a DFFR, a plurality of MUXs, and a plurality of NAND2s. In a further feature, the at least some of the logic cells further comprise a plurality of NANDI2s.

In another feature of this aspect, forming the first and second via layers includes configuring a plurality of vias in the first via layer and a plurality of vias in the second via layer to create connections from the first metal routing layer to the fourth metal routing layer. In a further feature, the connections created from the first metal routing layer to the fourth metal routing layer are completed using access wires, with each access wire including a fixed wire segment in the second metal routing layer, a fixed via in the third via layer, and a fixed wire segment in the third metal routing layer.

In another feature of this aspect, the step of forming a plurality of non-customized logic cell layers includes forming or selecting the logic cells from industry-standard libraries of standard-cells. Alternatively, the step of forming a plurality of non-customized logic cell layers includes forming or selecting the logic cells from user-customized libraries of standard-cells.

In another feature of this aspect, the method further includes prioritizing use of the first and second metal routing layers for short- to medium-distance routing, and prioritizing use of the third and fourth metal routing layers for medium- to long-distance routing.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein.

DETAILED DESCRIPTION OF THE PREFERRED EMBODIMENTS

Figure 1:
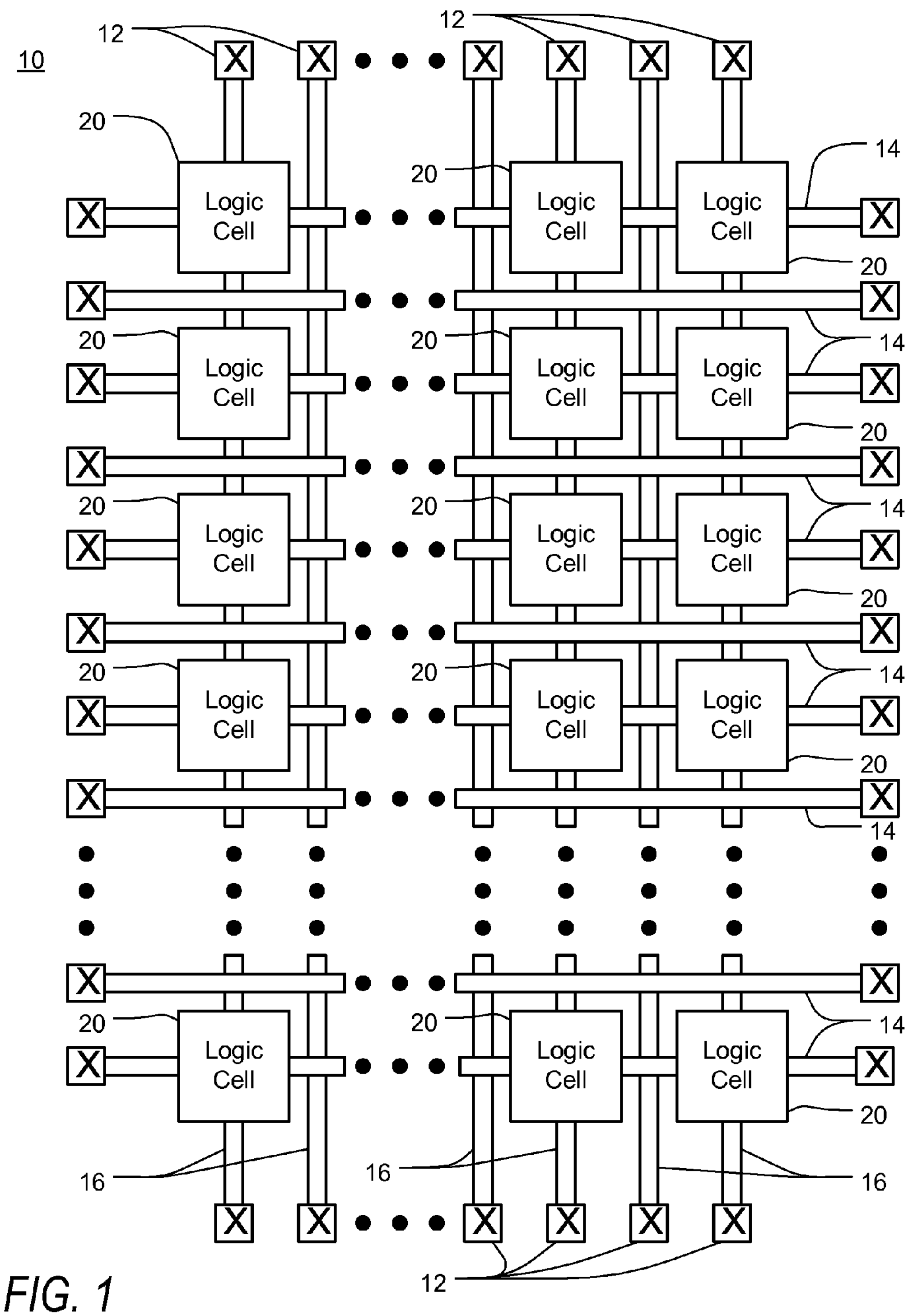
FIG. 1 is a block diagram representing the general architecture of a portion of an ASIC.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed; to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein-as understood by the Ordinary Artisan based on the contextual use of such term-differs in any way from any particular dictionary definition of such term, it is intended that the meaning of the term as understood by the Ordinary Artisan should prevail.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers", "a picnic basket having crackers without cheese", and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Further, the meaning of certain terms as used in the context of this disclosure should be understood as follows. The term "configuration" and variants such as "configurable" and "configured" refer to the property or process of imparting application-specific function to an integrated circuit chip. The term "metal layer" or "metal" refers to any layer that is used to make connections to implement the functions of the cells of a device. These metal layers may be the same for every version of a semiconductor device, or they may be used for configuration. In addition, metal layers may contain actual metal routing traces or vias, which provide connectivity between metal routing layers. In the case where such connectivity is created between metal routing layers, the metal layer may be referred to more specifically as a "via layer." The term "chip" and variations such as "integrated circuit chip" or "semiconductor chip" are normally meant to refer to an intermediate device that has not been configured, and may be in the form of a wafer. The term "device" or "semiconductor device" refers to a finished device such as a configured manufactured ASIC. The variant term "logic device" refers to a small set of transistor logic within a logic cell. The term "mask" refers to a physical glass plate or the like that defines any particular layer of a semiconductor chip. The term "macro" refers generally to a functional subunit of a semiconductor device design that may be reused within the same design or in a different design. Other terms will either be discussed when introduced, or otherwise should be assumed to have the conventional meaning as understood by the Ordinary Artisan.

Referring now to the drawings, in which like numerals represent like components throughout the several views, the preferred embodiments of the present invention are next described. The following description of the preferred embodiment(s) is merely exemplary in nature and is in no way intended to limit the invention, its application, or uses. Referring to the terminology used in describing the drawings, vertical and horizontal are used to describe relative direction and could be reversed based on the orientation of the particular object such as logic cell, logic device, or semiconductor chip, being described The present invention relates to aspects of a cell architecture for a structured ASIC that reduces the number of custom masks required, representing significant cost and time savings. In some embodiments, only two custom via layer masks are required; however, in other embodiments, two custom via layer masks and additional custom metal layer masks, typically disposed at a higher level than the custom via layer masks, could be used. With regard to the latter, the choice of two custom via layer masks may be used to create large macros for a design and the customer may want to then use these macros by connecting them together in their design using higher level metal layer masks.

As will be apparent to the Ordinary Artisan, each via layer mask determines where the so-called "vias" will be placed to make connections between metal routing layers. By using such an architecture, the semiconductor manufacturer may invest in the generic or base masks just one time. Various designs are then implemented by customizing just the via layer masks instead of a complete mask set. Many aspects of such an architecture are described in the '289 patent.

FIG. 1 is a block diagram representing the general architecture of a portion of an ASIC 10. The portion shown may, for example, represent a macro, large section of an ASIC, as described in the '289 patent. As more fully described therein, an ASIC has rows and columns of logic cells 20, where each cell 20 may implement a plurality of gates worth of logic. The number of gates in each cell 20 may be defined by the designer, but conventionally each cell 20 may comprise eight or ten standard-cell ASIC gates arranged into one or more logic devices. Horizontal routing tracks 14 and vertical routing tracks 16 connect the logic cells 20 together. These tracks 14,16 are formed of segmented wires of fixed length that may be connected to each other through vias (not shown). The inputs and outputs of the logic cells 20 communicate using routing tracks 14,16 that are connected through the vias 50,52,54, which are shown in more detail in FIG. 7. Some of the routing tracks 14,16 may also connect to pads 12, typically arranged around the edge of the die, that permit external connections to be made to the logic devices in the ASIC 10. In the case where the portion shown in FIG. 1 represents a macro, the pads 12 would be used to connect to other logic cells or other macros in the ASIC 10.

Figure 2A:
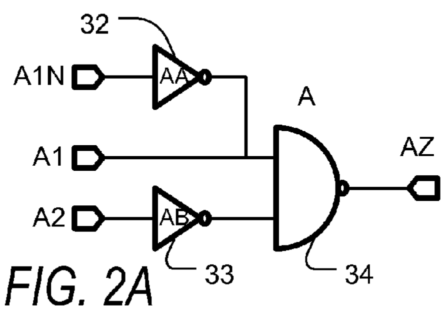
FIGS. 2A-2G are schematic diagrams illustrating standard-cells used in an exemplary implementation of the ASIC of FIG. 1 in accordance with the preferred embodiments of the present invention.
Figure 2B:
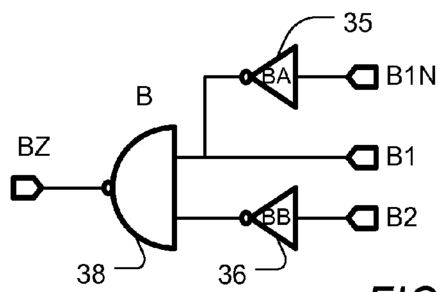
Figure 2C:
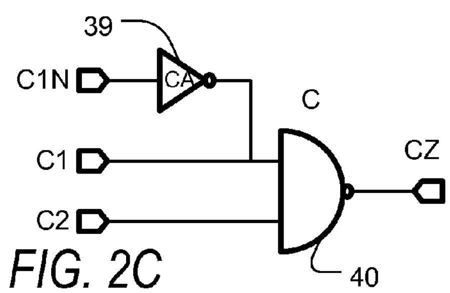
Figure 2D:
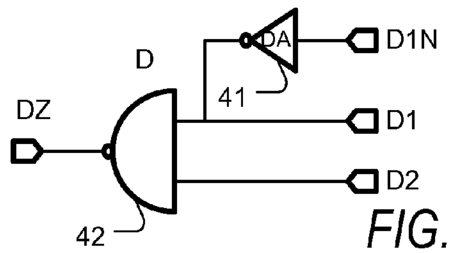
Figure 2E:
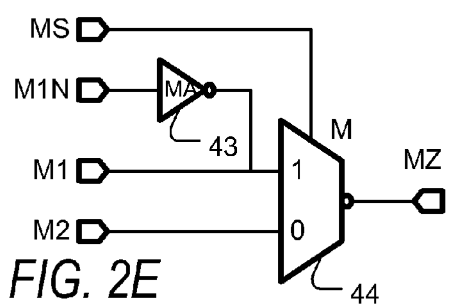
Figure 2F:
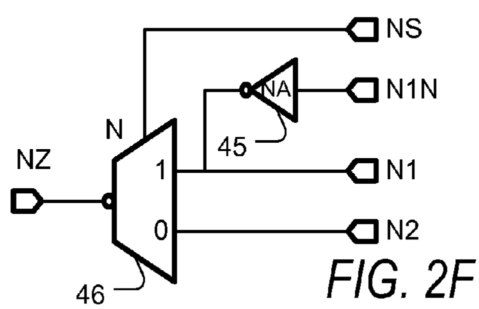
Figure 2G:
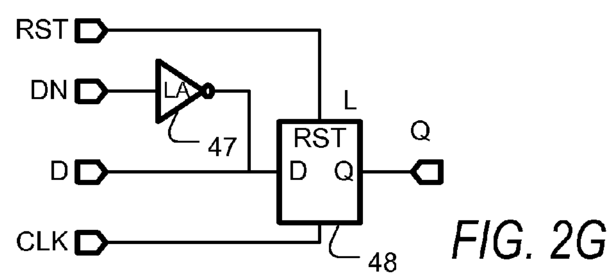

FIGS. 2A-2G are schematic diagrams illustrating standard-cells used in an exemplary implementation of the ASIC of FIG. 1 in accordance with the preferred embodiments of the present invention. The exemplary logic devices 32-48 may be contained in the logic cells 20 of FIG. 1 These exemplary logic devices are grouped to include: a flip-flop 48 with reset, referred to generally hereinafter a "DFFR" standard-cell, and optional inverter 47 as shown in FIG. 2G; two 2-to-1 multiplexors 44,46, referred to generally hereinafter as "MUX" standard-cells, with optional inverters 43,45 as shown in FIGS. 2E and 2F; and two 2-input NAND gates 40,42, referred to generally hereinafter as "NAND2" standard-cells, with optional inverters 39,41 as shown in FIGS. 2C and 2D. In addition, if a customer's standard-cell library provides it, two 2-input NAND gates 34,38 with a respective inverting input 33,36, referred to generally hereinafter as "NANDI2" standard-cells, with optional inverters 32,35 as shown in FIGS. 2A and 2B. However, it will be understood that the present invention will be equally applicable to a wide variety of other types of logic devices and standard-cells (not shown), including without limitation XORs, NORs, and look-up tables, the design and operation of each of which will be apparent to the Ordinary Artisan. The DFFRs, MUXs, NAND2s and NANDI2s in FIGS. 2A-2G have been selected merely as particularly suitable illustrations of the usefulness of the present invention. Notably, although these exemplary logic devices may be custom standard-cells provided by the vendor of the particular technology described herein, this is not necessary; indeed, all of these exemplary logic devices may be part of a customer's industry proven standard-cell library. Further, although not illustrated, each of these exemplary logic devices conventionally uses other inputs, such as VDD and VSS, to control input and output levels; these inputs are hardwired into the logic cell 20.

Figure 3A:
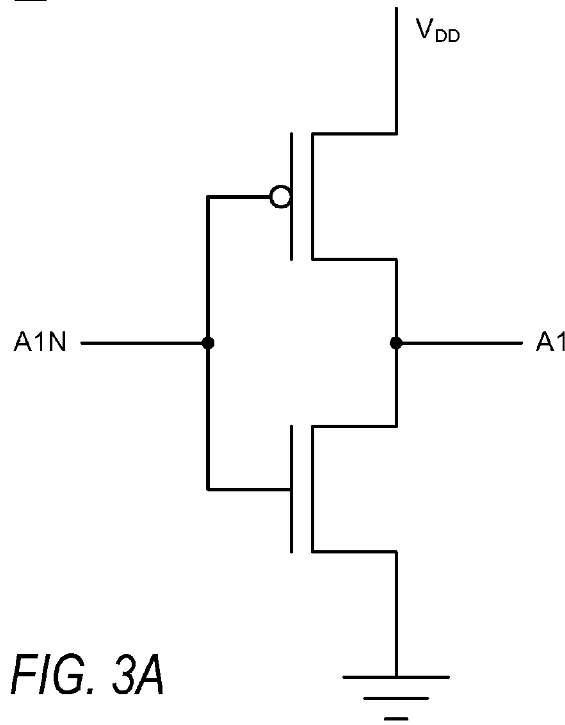
FIGS. 3A and 3B are CMOS transistor schematic examples of the INV and NAND logic devices, respectively, of FIG. 2A.
Figure 3B:
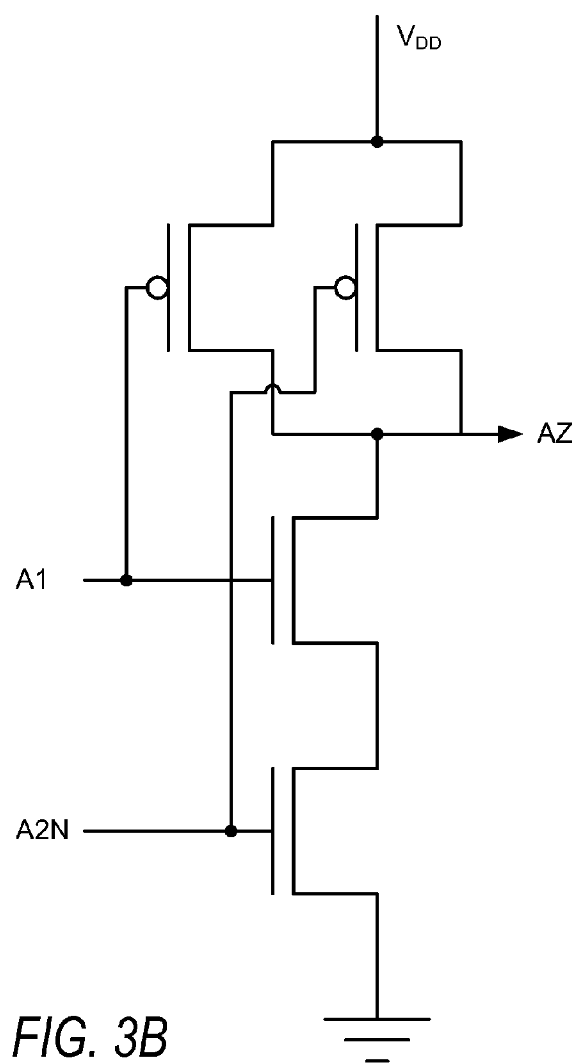
Figure 4:
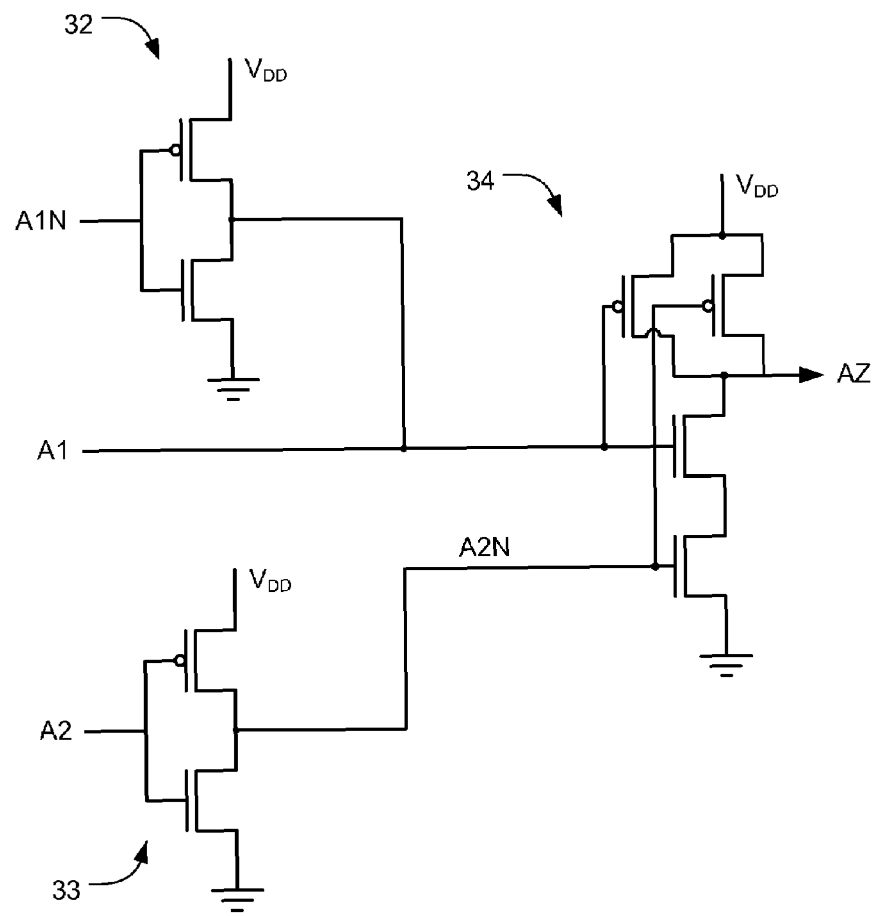
FIG. 4 is a CMOS transistor schematic of the INV and NAND logic devices of FIGS. 3A and 3B, and an additional INV logic device, shown connected together.

As will be appreciated by the Ordinary Artisan, the exemplary logic devices 32-48 are small sets of transistors that may be combined together to create higher-order logic devices or standard-cells. FIGS. 3A and 3B are CMOS transistor schematic examples of the INV and NAND logic devices 32,34, respectively, of FIG. 2A, while FIG. 4 is a CMOS transistor schematic of the INV and NAND logic devices 32,34 of FIGS. 3A and 3B, and an additional INV logic device 33, shown connected together. As illustrated therein, the smaller logic devices 32,33,34 may be combined, typically using wiring in the METAL1 metal routing layer, to form the larger standard-cell shown in block diagram form in FIG. 2A. The formation of these standard-cells, including the physical location of the transistors and METAL1 wires, is unique to a particular standard-cell library a customer is using. While the internal logical operation of the NANDI2 logic cell shown in FIG. 2A is the same as that of the NANDI2 logic cell shown in FIG. 2B, and in fact is the same for every NANDI2 logic cell in every library, the physical layout, location of the transistors that form the logic devices and the location of METAL1 wires may vary for the different standard-cell libraries in the industry.

Figure 5:
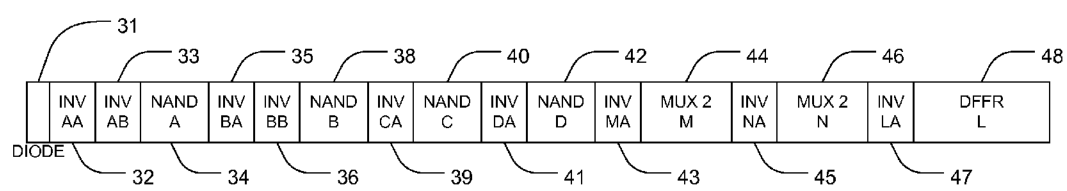
FIG. 5 is a physical diagram of a row of exemplary logic devices which correspond to the standard-cell schematics shown in FIGS. 2A-2G.

FIG. 5 is a physical diagram of a row of exemplary logic devices which correspond to the standard-cell schematics shown in FIGS. 2A-2G. The logic devices 32-48 from FIGS. 2A-2G are grouped together in a row along with a diode device 31 which can be used for fixing antenna violations that might occur on that particular block of logic. These logic devices, and thus the standard-cells that they make up, are put together in a single horizontal standard-cell row to form a logic cell. In particular, FIG. 5 is exemplary logic for a single logic cell 20 in FIG. 1. These logic cells 20 are tiled vertically and horizontally in a grid to create a "footprint," which is an array of logic cells 20 sized to fit the customer's need. The general arrangement of logic cells 20 used to build an ASIC 10 or macro for an ASIC 10 is shown in FIG. 1, described previously.

Figure 6A:
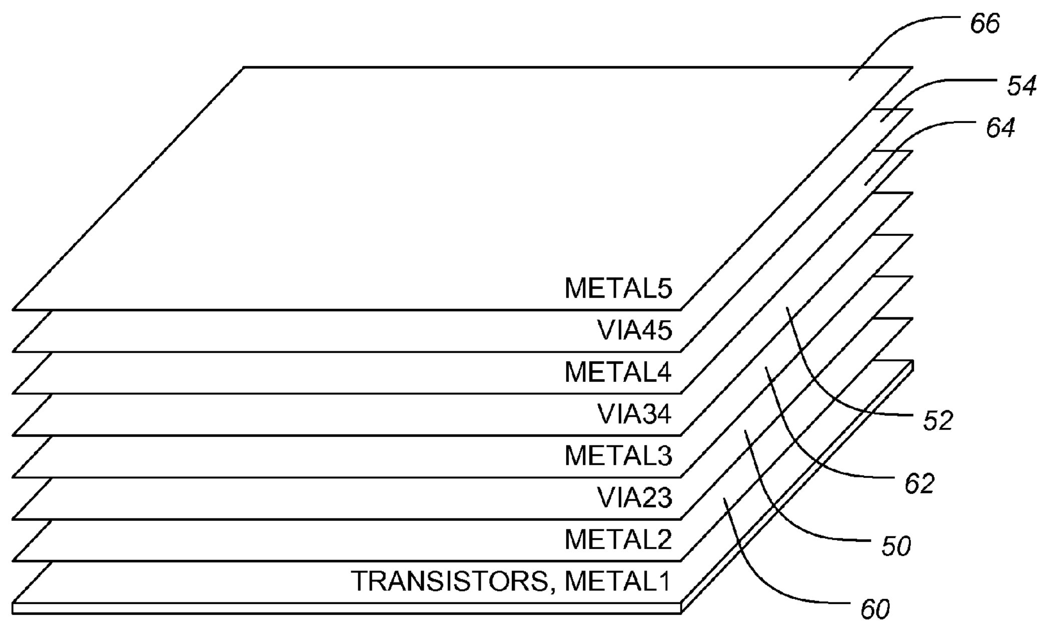
FIG. 6A is a schematic diagrams of the layers of an exemplary semiconductor chip.

After the logic cells, made up of standard-cells, are arrayed, metal layers (separate from the METAL1 layer of the standard-cells) are designed to interconnect the logic cells. These interconnect metal layers may include both routing layers and via layers. FIG. 6A is a schematic diagrams of the layers of an exemplary semiconductor chip. As shown therein, the interconnect metal layers may include routing layers named METAL2, METAL3, METAL4 and METAL5, and via layers named VIA23, VIA34 and VIA45, where METAL2 is directly beneath VIA23, VIA23 is directly beneath METAL3, METAL3 is directly beneath VIA34, and the like.

Figure 6B:
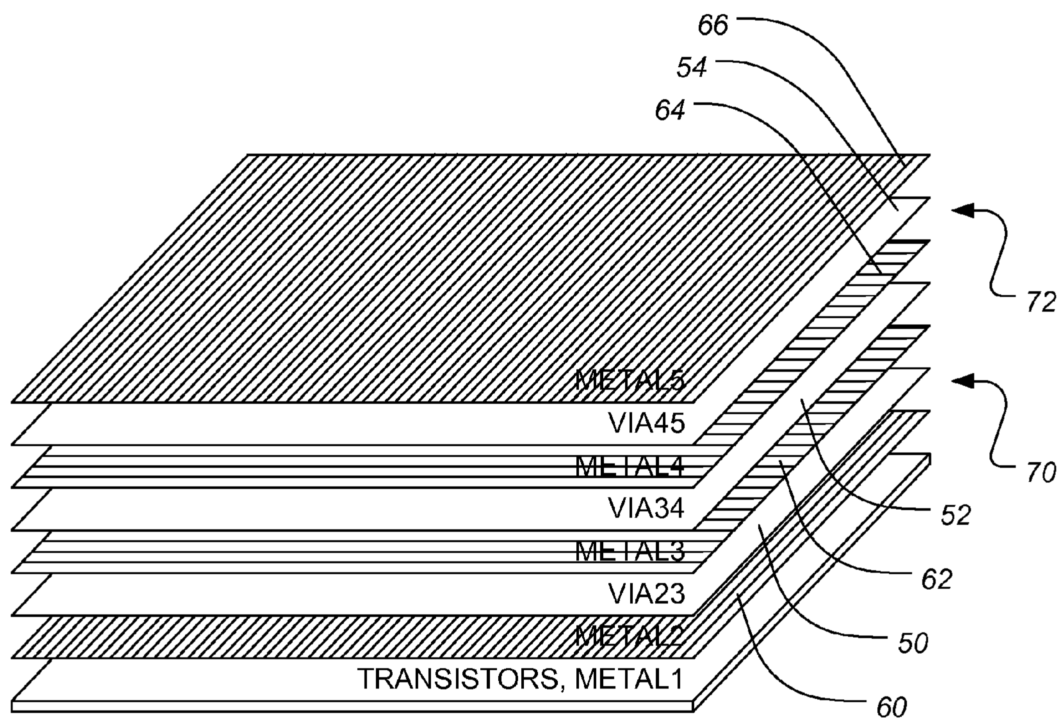
FIGS. 6B and 6C are alternative schematic diagrams of the layers of the exemplary semiconductor chip of FIG. 6A, illustrating the pairing of vertically-running routing layers with horizontally-running routing layers.
Figure 6C:
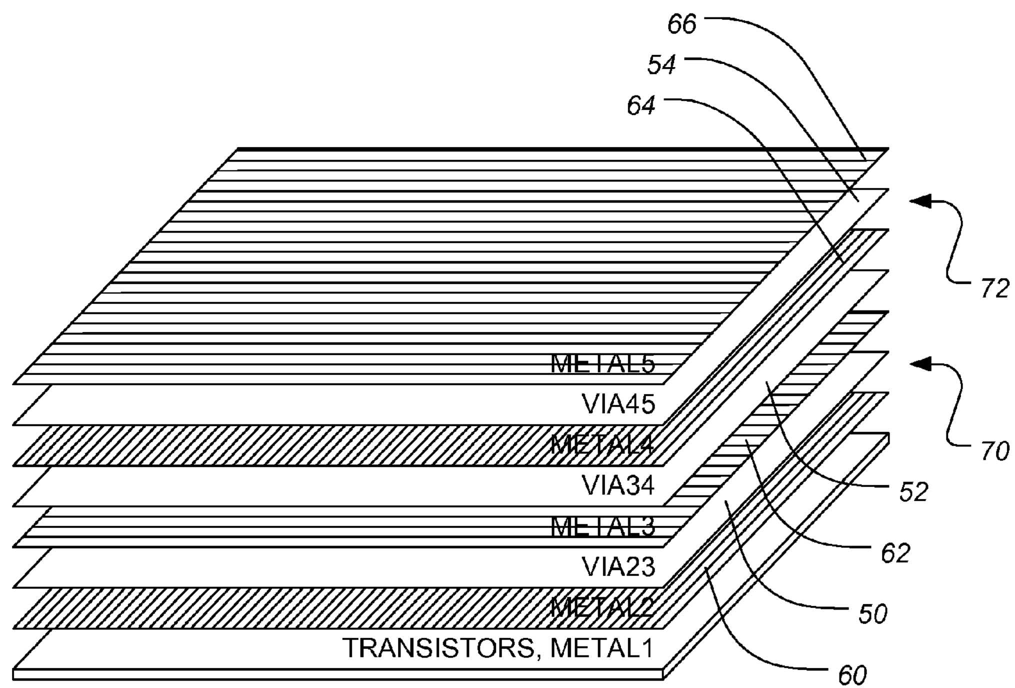

In a semiconductor chip having the layers shown in FIG. 6A, it is commonplace to arrange the routing layers in pairs such that a routing layer, or section of routing layer, whose wires primarily run vertically is located adjacent a corresponding routing layer, or section of routing layer, whose wires primarily run horizontally. The pairs of routing layers are sometimes referred to herein as "routing grids." FIGS. 6B and 6C are alternative schematic diagrams of the layers of the exemplary semiconductor chip of FIG. 6A, illustrating the pairing of vertically-running routing layers with horizontally-running routing layers to form two routing grids 70,72. In FIG. 6B, METAL2 60 and METAL5 66 run vertically and METAL3 62 and METAL4 64 run horizontally, while in FIG. 6C, METAL2 60 and METAL4 64 run vertically and METAL3 62 and METAL5 66 run horizontally. It will be apparent that the present invention is applicable to both arrangements.

Regardless of the arrangement utilized, the interconnect metal layers are created by generating a mask for each layer. As described previously, NRE and turn-time can be reduced by configuring only a subset of the metal layers. For example, in a two layer custom mask process, all of the layers in the standard-cells and all metal layer masks except for two are fixed. In other words, the standard-cell layer masks and all but two of the metal layer masks are fixed, such that the customer does not have access to these masks (or layers) to configure the operation of the semiconductor chip. These fixed layer masks include transistor layers, contacts (cuts to form connections from the transistor base layers to METAL1), METAL1, and all but two of the routing and via layers. These standard-cell layer masks and fixed metal layer masks may be reused for various designs, just as transistor layers are reused on gate arrays.

Figure 7:
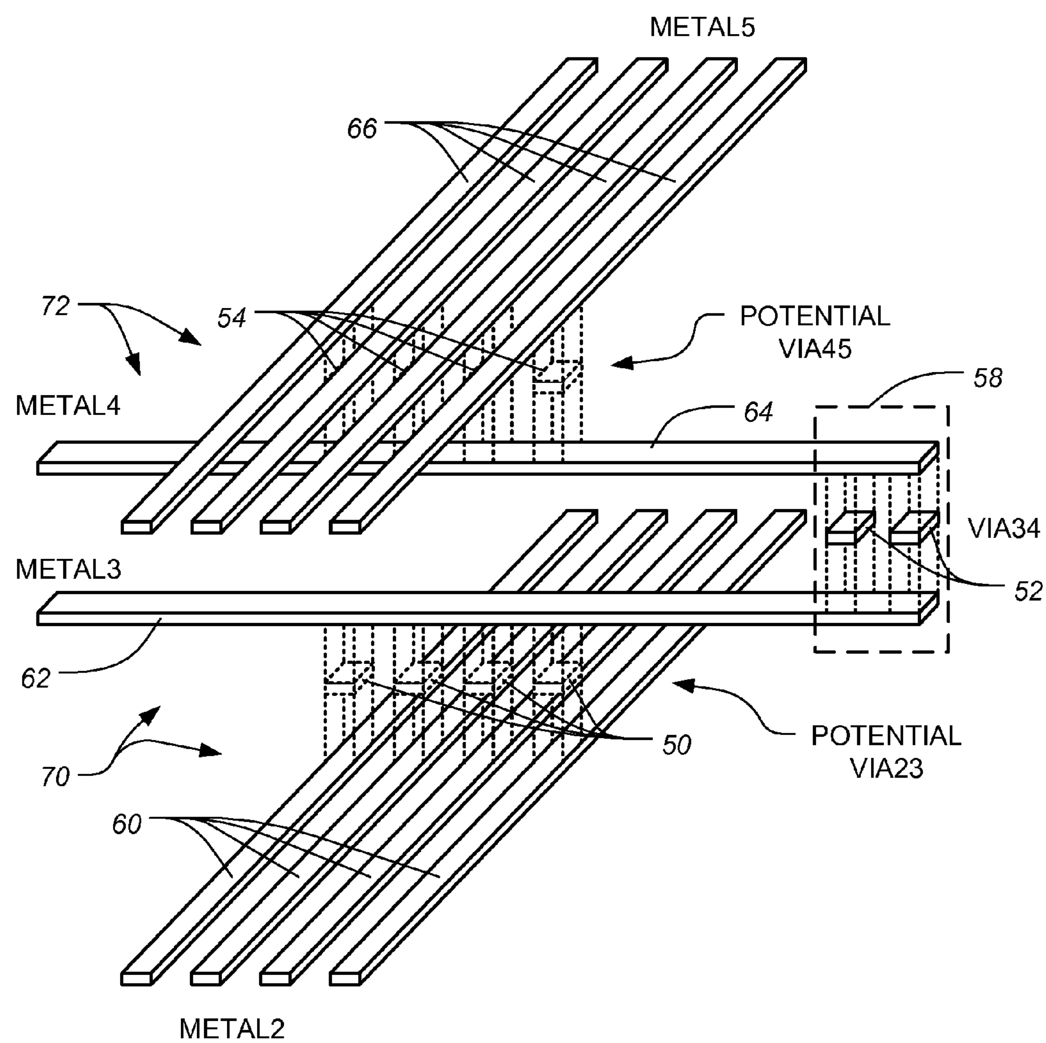
FIG. 7 is a physical diagram of layers METAL2, VIA23, METAL3, VIA34, METAL4, VIA45, and METAL5 in a section of exemplary logic where VIA23 and VIA45 are used for configuration layers, all in accordance with the preferred embodiments of the present invention.

Conventionally, the two remaining layers, which are referred to as "configuration layers" or "customized layers" because they permit the operation of the semiconductor chip to be configured or customized, may be two routing layers, one routing layer and one via layer, or two adjacent via layers, all as described in commonly-assigned U.S. patent application Ser. No. 11/469,189, the entirety of which is incorporated herein by reference. In the present invention, however, the two configurable layers are non-adjacent via layers, thereby allowing more efficient configuration of the semiconductor chip. For example, in the example described above, METAL2, METAL3, VIA34, METAL4 and METAL5 may be fixed layers, while two non-adjacent via layers, VIA23 and VIA45, may be used as configuration layers. Such an arrangement is shown in FIG. 7, which is a physical diagram of layers METAL2, VIA23, METAL3, VIA34, METAL4, VIA45, and METAL5 in a section of exemplary logic where VIA23 and VIA45 are used for configuration layers, all in accordance with the preferred embodiments of the present invention. As with conventional arrangements, the standard-cell layer masks and fixed metal layer masks may be reused for various designs, just as transistor layers are reused on gate arrays. The non-adjacent via layers, VIA23 and VIA45 in the exemplary logic, are then created by the customer as custom masks to configure the operation of the semiconductor chip.

Advantages provided by using non-adjacent configuration layers may be understood as follows. First, by way of background, it will be recognized that semiconductor chips having four routing layers (METAL2, METAL3, METAL4 and METAL5) generally use the first routing grid 70 (METAL2-VIA23-METAL3 60,50,62) routing for input and output signals and short-distance routing, while the second grid 72 (METAL4-VIA45-METAL5 64,54,66) routing for medium and long-distance routing. Semiconductor chip designs having a greater number of routing and via layers also make use of layers above METAL5 for long-distance routing, an arrangement shown schematically in FIG. 10. For example, where, as described previously, FIG. 1 is exemplary logic for a macro in a semiconductor chip, the designer often uses the layers above METAL5 to connect the various macros together to build a complete semiconductor chip. More details of how to build via-configured routing meshes are provided in the aforementioned '289 patent.

The benefits of a configured routing mesh technology using non-adjacent via layers for configuration become clear when examining the number of horizontal and vertical routing tracks supported using configurable adjacent via layers versus configurable non-adjacent via layers. If, as is the case in the exemplary arrangement shown in FIGS. 6B and 7, METAL2 60 and METAL5 66 run vertically and METAL3 62 and METAL4 64 run horizontally, then using adjacent via layers such as VIA23 50 and VIA34 54 for configuration gives the customer METAL2 for input and output signals and short-distance vertical routing, while METAL3 is used for I/O connections and horizontal routing, and METAL4 would be used for horizontal medium and long-distance routing. In this example, because the customer is using only VIA23 and VIA34 for configuration, they have no direct access to vertical METAL5 during configuration. This significantly limits the availability of routing in the METAL5 layer, therefore forcing much of the vertical routing that otherwise would be located there into METAL2 instead. In particular, when a designer tries to use fixed routing layers that are not directly adjacent to a via configuration layer for routing, the layer is essentially restricted to long-distance routing only; therefore, in the example, the designer would have no access to METAL5 for medium distance routing. Because METAL2 is the only remaining short to medium distance vertical routing layer, METAL2 becomes a routing bottleneck.

On the other hand, using non-adjacent via layers for configuration opens access to both of the upper metal layers METAL4 and METAL5 and thus solves the routing bottleneck problem in METAL2 60 presented in the previous example. Using VIA23 50 and VIA45 54 for configuration allows layers METAL2 60 and METAL5 66 to be used for vertical routing and METAL3 62 and METAL5 66 to be used for horizontal routing. The direct availability of METAL5 66 greatly increases the number of useful vertical routing tracks and thus reduces the bottleneck described above. Notably, in the example shown in FIG. 7, VIA23 50 and VIA45 54 are not shown configured, but rather all potential configuration connections are shown with a small box 50,54 shown where the metal layers cross.

Alternatively, in the exemplary arrangement shown in FIG. 6C, where METAL2 and METAL4 run vertically and METAL3 and METAL5 run horizontally, then using VIA23 50 and VIA45 54 for configuration allows layers METAL2 60 and METAL4 64 be used for vertical routing and METAL3 62 and METAL5 66 to be used for horizontal routing, once again greatly increasing the number of useful vertical routing tracks and thus reducing the bottleneck described above.

To allow signals to traverse between the lower routing grid (i.e., on METAL2-VIA23-METAL3 60,50,62) of the exemplary logic and the upper routing grid (i.e., METAL4-VIA45-METAL5 64,54,66) of the exemplary logic, "access wires" 58 on METAL3 62 and METAL4 64 are introduced. These are fixed segments of METAL3 and METAL4 wire 62,64 connected to vias in VIA34 52, thereby providing connectivity from METAL3 62, through VIA34 52, to METAL4 64. This allows signals in METAL2 60, crossing below access wires 58, to connect to the access wires 58 through a configurable via in the VIA23 layer 50, and signals in METAL5 66, crossing above access wires 58, to connect to the access wires 58 through a configurable via in the VIA45 layer 54.

FIG. 7 illustrates one of the simplest implementations of the present invention. This implementation is likewise illustrated in FIG. 8, which is a schematic diagram of the layers of an exemplary semiconductor chip illustrating the implementation of FIG. 7. In particular, the exemplary semiconductor chip includes four metal routing layers and three via layers on top of transistors, METAL1, and the like. A first via layer (VIA23 50), which is configurable, is disposed directly on top of a first metal routing layer (METAL2 60), which is non-configurable; a second metal routing layer (METAL3 62), which is non-configurable, is disposed directly on top of the first via layer (VIA23 50); a second via layer (VIA34 52), which is non-configurable, is disposed directly on top of the second metal routing layer (METAL3 62); a third metal routing layer (METAL4 64), which is non-configurable, is disposed directly on top of the second via layer (VIA34 52); a third via layer (VIA45 54), which is configurable, is disposed directly on top of the third metal routing layer (METAL4 64); and a fourth metal routing layer (METAL5 66), which is non-configurable, is disposed directly on top of the third via layer (VIA45 54).

Figure 8:
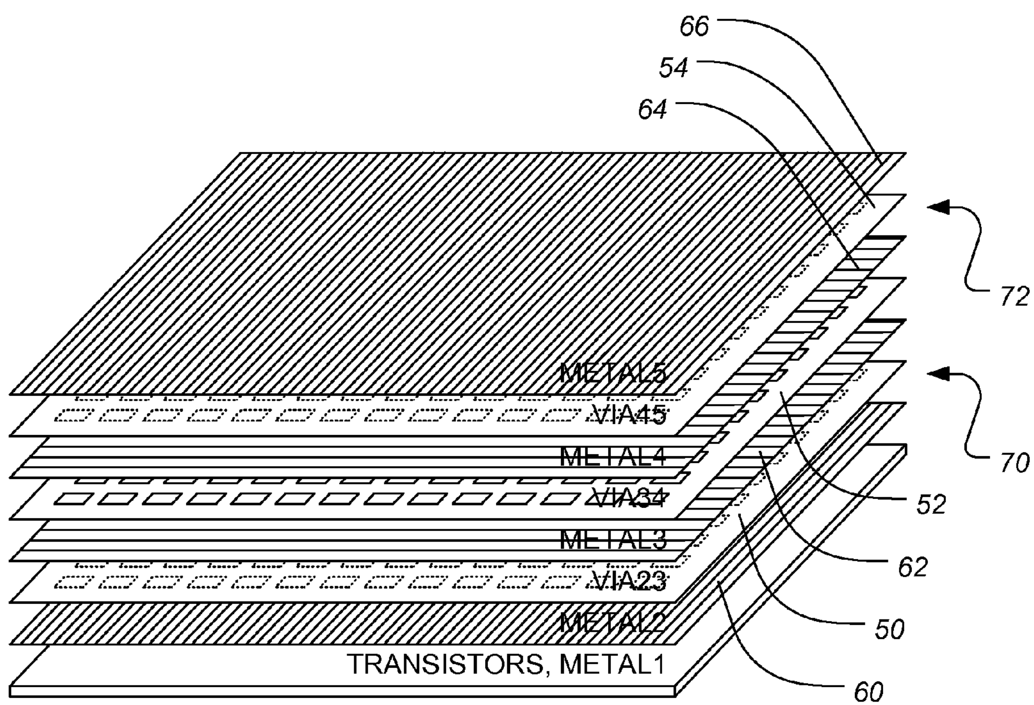
FIG. 8 is a schematic diagram of the layers of an exemplary semiconductor chip illustrating the implementation of FIG. 7.
Figure 9:
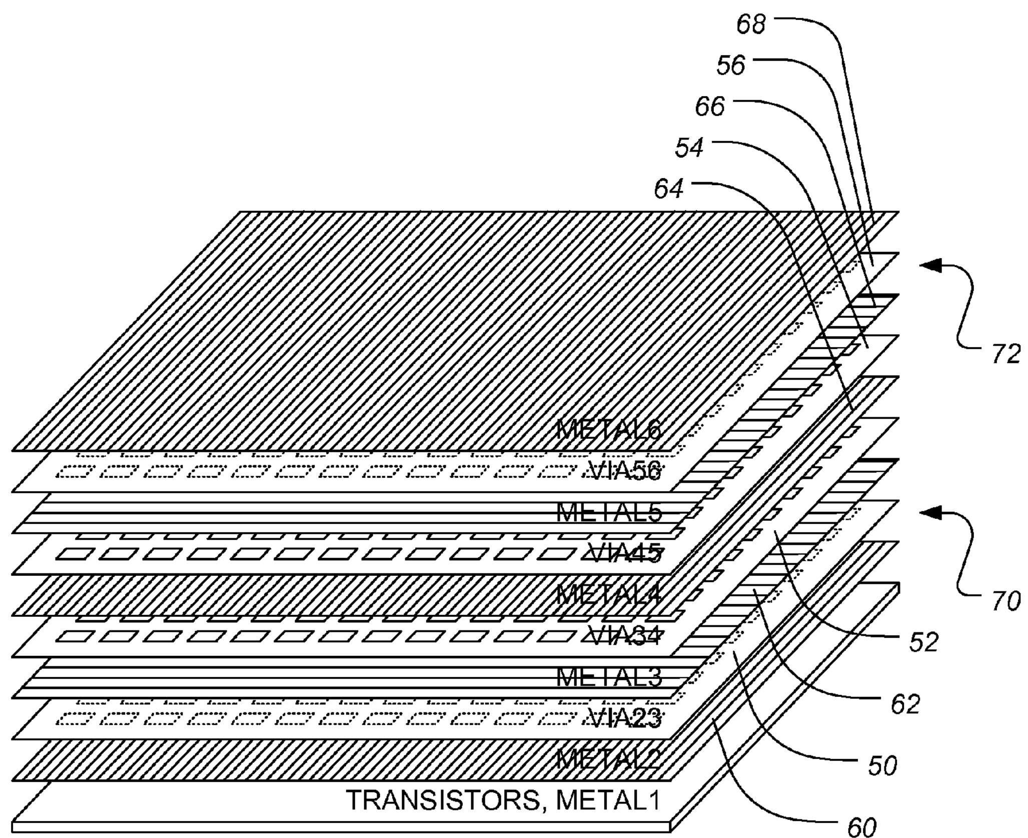
FIGS. 9 and 10 are schematic diagrams of the layers of two other exemplary semiconductor chips, each illustrating a variation of the basic implementation shown in FIGS. 7 and 8.
Figure 10:
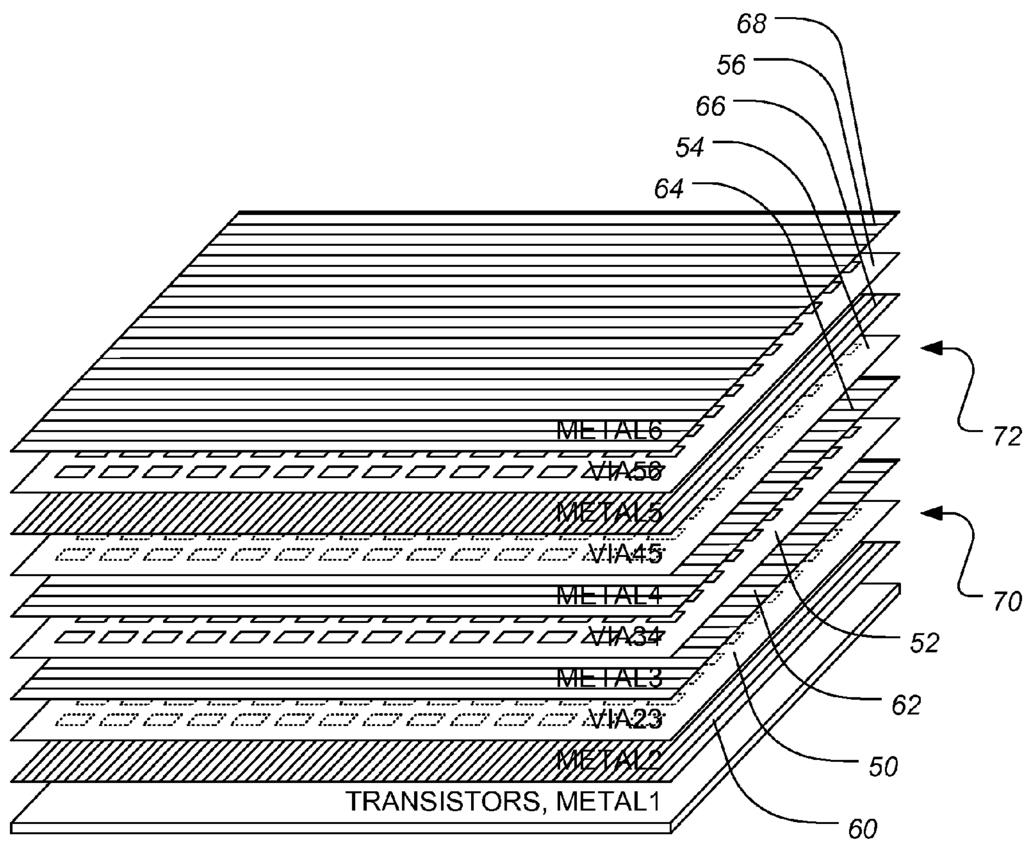

FIGS. 9 and 10 are schematic diagrams of the layers of two other exemplary semiconductor chips, each illustrating a variation of the basic implementation shown in FIGS. 7 and 8. In FIG. 9, a fifth non-configurable metal routing layer and fourth via layer have been added, and the two non-adjacent configurable via layers are now VIA23 50 and VIA56 56.

Thus, an extra metal routing layer (for example, METAL4 64) and an extra via layer (for example, VIA45 54) are now disposed between the two non-adjacent configurable via layers as compared to the arrangement of FIG. 8. In the arrangement of FIG. 9, the first routing grid 70 comprises METAL2 60, VIA23 50 and METAL3 62, while the second routing grid 72 comprises METAL5 66 VIA56 56 and METAL6 68. By comparison, in FIG. 10, a fifth non-configurable metal routing layer and fourth via layer have also been added, but in this implementation the extra layers have been added on top of the topmost layer in FIG. 8. Thus, the two non-adjacent configurable via layers in FIG. 10 are the same as in FIG. 8 (VIA23 50 and VIA56 56), but an extra metal routing layer (METAL6 68) and an extra via layer (VIA56 56) are now disposed on top of METAL5 as compared to the arrangement of FIG. 8. In the arrangement of FIG. 10, the first routing grid 70 comprises METAL2 60, VIA23 50 and METAL3 62, while the second routing grid 72 comprises METAL4 64 VIA45 54 and METAL5 66.

Although a wide variety of additional implementations will be apparent to the Ordinary Artisan in view of the above teachings, perhaps the most common application of the present invention is illustrated collectively in FIGS. 7-10, wherein a first routing grid 70 is formed from a configurable via layer sandwiched between a pair of non-configurable metal routing layers that generally correspond to each other (such as a first non-configurable metal routing layer, or section of routing layer, whose wires primarily run vertically located adjacent a second non-configurable metal routing layer, or section of routing layer, whose wires primarily run horizontally) and a second routing grid 72 is formed from another configurable via layer sandwiched between another pair of non-configurable metal routing layers that generally correspond to each other, and an additional via layer, which is non-configurable, is disposed directly in between the first and second routing grids. Additional non-configurable layers may be disposed in between the two sets of layers, as generally illustrated in FIG. 9, and/or additional layers may be disposed on top of the two sets of layers, as generally illustrated in FIG. 10, but in each case, access wires 58 permit connections to be made from the lower routing grid 70 and the upper routing grid 72.

It will be appreciated that the teachings of the present invention are appropriate for a wide variety of applications, but to illustrate the utility of the foregoing techniques and structures, the following example of use is provided. A particular customer may wish to develop a series of semiconductor devices for a particular application, such as to operate the electronic system of an automobile. While the majority of the functionality of these devices will be very similar in all of the device designs, there may be features for particular automobiles that must be specially designed and thus will require customization of the semiconductor device.

To develop the series of semiconductor devices, the customer will first design the logic functionality of their master semiconductor device in software. The master design will include all of the functionality that is shared among the automobiles but with extra logic for options specific to the different automobiles. Once the logic functionality which describes the device is completed, then the process of designing and arraying the logic cells to implement the functionality is completed. Next, the designer will partially route these logic cells using the routing meshes described and illustrated in FIGS. 6A, 6B, 6C and 7 and accompanying text. The routing is generally done using a software program specifically for the purpose of generating the routing meshes.

The basic semiconductor chip thus designed may then be customized or configured by selecting the necessary connections in the metal routing meshes using VIA23 and VIA45 or another pair of non-adjacent configurable via layers. This is generally done by entering the designed logical outputs into a software program which then selects the necessary via locations to generate the correct logical outputs of the semiconductor device. Finally, all of the transistor layer masks and metal layer masks are created. These are master copies of the physical design of the customer's semiconductor device, and will subsequently be used by the fabrication process as a map to produce the semiconductor device.

Advantageously, if the customer needs to customize the semiconductor device for a different automobile, the customer need only go back to the point where they customized the semiconductor chip. The customer will select the new necessary connections in the metal routing meshes to generate any new features in the semiconductor device for the new automobile, again using VIA23 and VIA45. All of the other physical layers of the semiconductor chip will remain unchanged. Thus, each new semiconductor device design requires only two new masks (i.e., the ones for the VIA23 and VIA45 layers) to be created instead of the 10-12, for example, that had to be created initially, thus providing the customer with significant savings in time and money during the fabrication process.

Based on the foregoing information, it is readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention. Accordingly, while the present invention has been described herein in detail in relation to its preferred embodiment, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof Although specific terms are employed herein, they are used in a generic and descriptive sense only and not for the purpose of limitation.

What is claimed is:

1. A semiconductor device comprising:

a plurality of non-customized layers in which are arranged an array of logic cells, each logic cell including a plurality of logic devices;

a first routing grid that includes a first non-customized metal routing layer, a first via layer, and a second non-customized metal routing layer, wherein the first via layer is a customized via layer that is disposed directly on top of the first non-customized metal routing layer and the second non-customized metal routing layer is disposed directly on top of the first via layer;

a second routing grid, disposed above the first routing grid, that includes a third non-customized metal routing layer, a second via layer, and a fourth non-customized metal routing layer, wherein the second via layer is a customized via layer that is disposed directly on top of the third non-customized metal routing layer and the fourth non-customized metal routing layer is disposed directly on top of the third via layer; and a third via layer disposed above the first routing grid and beneath the second routing grid, the third via layer being a non-customized via layer.

2. The semiconductor device of claim 1, wherein the device is an application-specific integrated circuit.

3. The semiconductor device of claim 2, wherein the first metal routing layer is METAL2, the first via layer is VIA23 and the second metal routing layer is METAL3.

4. The semiconductor device of claim 3, wherein the third metal routing layer is METAL4, the second via layer is VIA45 and the fourth metal routing layer is METAL5.

5. The semiconductor device of claim 2, wherein a fifth non-customized metal routing layer and a fourth via layer are interposed between the first routing grid and the second routing grid, the fourth via layer being non-customized.

6. The semiconductor device of claim 2, wherein a fifth non-customized metal routing layer and a fourth via layer are disposed above the fourth metal routing layer.

7. The semiconductor device of claim 6, wherein the fifth metal routing layer forms a part of a third routing grid, the third routing grid further including a sixth metal routing layer and a fifth via layer that are disposed above the fifth metal routing layer.

8. The semiconductor device of claim 7, wherein the fifth metal routing layer is METAL6, the fifth via layer is VIA67 and the sixth metal routing layer is METAL7.

9. The semiconductor device of claim 2, wherein the array of logic cells are fabricated in a first process geometry, and wherein the customized layers are fabricated in a second process geometry.

10. The semiconductor device of claim 2, wherein at least some of the logic cells comprise:

a DFFR;

a plurality of MUXs; and a plurality of NAND2s.

11. The semiconductor device of claim 10, wherein the at least some of the logic cells further comprise a plurality of NAND2s.

12. The semiconductor device of claim 2, wherein the first via layer and the second via layer are customized by configuring a plurality of vias in the first via layer and a plurality of vias in the second via layer to create connections from the first routing grid to the second routing grid.

13. The semiconductor device of claim 12, wherein the connections created from first routing grid to the second routing grid are completed using access wires, each access wire including a fixed wire segment in the second metal routing layer, a fixed via in the third via layer, and a fixed wire segment in the third metal routing layer.

14. The semiconductor device of claim 2, wherein the logic cells are formed or selected from industry-standard libraries of standard-cells.

15. The semiconductor device of claim 2, wherein the logic cells are formed or selected from user-customized libraries of standard-cells.

16. A method of making a semiconductor device, the method comprising:

forming a plurality of non-customized layers in which are arranged an array of logic cells, each logic cell including a plurality of logic devices;

forming a first routing grid, including:

forming a first non-customized metal routing layer above the plurality of non-customized layers, forming a first via layer directly on top of the first non-customized metal routing layer, wherein the first via layer is a customized via layer, and forming a second non-customized metal routing layer directly on top of the first via layer;

forming a second routing grid, above the first routing grid, including:

forming a third non-customized metal routing layer, forming a second via layer directly on top of the third non-customized metal routing layer, wherein the second via layer is a customized via layer, and forming a fourth non-customized metal routing layer directly on top of the third via layer; and forming a third via layer above the first routing grid and beneath the second routing grid, the third via layer being a non-customized via layer.

17. The method of claim 16, wherein:

the step of forming the first via layer includes producing a first customized mask, and forming the first via layer using the first customized mask; and the step of forming the second via layer includes producing a second customized mask, and forming the second via layer using the second customized mask.

18. The method of claim 17, wherein the device is an application-specific integrated circuit.

19. The method of claim 18, wherein the step of forming the first routing grid includes forming the first metal routing layer directly on top of the plurality of non-customized layers.

20. The method of claim 19, wherein the first metal routing layer is METAL2, the first via layer is VIA23 and the second metal routing layer is METAL3.

21. The method of claim 20, wherein the third metal routing layer is METAL4, the second via layer is VIA45 and the fourth metal routing layer is METAL5.

22. The method of claim 18, further comprising the steps of forming a fifth non-customized metal routing layer and forming a fourth via layer between the first via layer and the second via layer, the fourth via layer being non-customized.

23. The method of claim 18, further comprising the steps of forming a fifth non-customized metal routing layer and forming a fourth via layer above the fourth metal routing layer.

24. The method of claim 23, wherein the steps of forming a fifth non-customized metal routing layer and a fourth via layer above the fourth metal routing layer are part of a step of forming a third routing grid, and wherein the step of forming a third routing grid further includes the steps of forming a sixth metal routing layer and forming a fifth via layer above the fifth metal routing layer.

25. The semiconductor device of claim 24, wherein the fifth metal routing layer is METAL6, the fifth via layer is VIA67 and the sixth metal routing layer is METAL7.

26. The method of claim 18, wherein the step of forming the plurality of non-customized layers in which are arranged an array of logic cells includes forming the non-customized layers in a first process geometry, and wherein the steps of forming the first and second customized via layers includes fabricating the first and second customized via layers in a second process geometry.

27. The method of claim 18, wherein at least some of the logic cells comprise:

a DFFR;

a plurality of MUXs; and a plurality of NAND2s.

28. The method of claim 27, wherein the at least some of the logic cells further comprise a plurality of NANDI2s.

29. The method of claim 18, wherein forming the first and second via layers includes configuring a plurality of vias in the first via layer and a plurality of vias in the second via layer to create connections from the first routing grid to the second routing grid.

30. The method of claim 29, wherein the connections created from the first routing grid to the second routing grid are completed using access wires, each access wire including a fixed wire segment in the second metal routing layer, a fixed via in the third via layer, and a fixed wire segment in the third metal routing layer.

31. The method of claim 18, wherein the step of forming a plurality of non-customized logic cell layers includes forming or selecting the logic cells from industry-standard libraries of standard-cells.

32. The method of claim 18, wherein the step of forming a plurality of non-customized logic cell layers includes forming or selecting the logic cells from user-customized libraries of standard-cells.

33. The method of claim 18, further comprising the step of prioritizing use of the first routing grid for short- to medium-distance routing, and prioritizing use of the second routing grid for medium- to long-distance routing.

* * * * *